(12) United States Patent
Ura et al.

(10) Patent No.: US 7,749,790 B2
(45) Date of Patent: Jul. 6, 2010

(54) PHOTOELECTRIC CONVERSION DEVICE AND IMAGE PICKUP SYSTEM WITH PHOTOELECTRIC CONVERSION DEVICE

(75) Inventors: Ken-ichiro Ura, Atsugi (JP); Yoshihiko Fukumoto, Isehara (JP); Yuzo Kataoka, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 12/259,347

(22) Filed: Oct. 28, 2008

(65) Prior Publication Data

US 2009/0053849 A1    Feb. 26, 2009

Related U.S. Application Data

(62) Division of application No. 11/767,779, filed on Jun. 25, 2007, now Pat. No. 7,459,760.

(30) Foreign Application Priority Data

Jul. 10, 2006    (JP)    ............................. 2006-189244

(51) Int. Cl.
*H01L 21/00* (2006.01)
(52) U.S. Cl. ........................................ 438/48; 257/444
(58) Field of Classification Search .................... 438/48; 257/444

See application file for complete search history.

(56) References Cited

U.S. PATENT DOCUMENTS

| 6,774,453 | B2 | 8/2004 | Okita ......................... 257/506 |
| 7,187,052 | B2 | 3/2007 | Okita et al. ................. 257/444 |
| 2007/0085110 | A1 | 4/2007 | Okita et al. ................. 257/239 |

FOREIGN PATENT DOCUMENTS

| JP | 2001-230409 A | 8/2001 |
| JP | 2003-258229 A | 9/2003 |
| JP | 2005-142503 A | 6/2005 |

*Primary Examiner*—Douglas M Menz
(74) *Attorney, Agent, or Firm*—Fitzpatrick, Cella, Harper & Scinto (57) ABSTRACT

A photoelectric conversion device comprises a first semiconductor region of a first conductivity type; a second semiconductor region of a second conductivity type serving as a photoelectric conversion element together with a part of the first semiconductor region; a gate electrode transferring electric carriers generated in the photoelectric conversion element to a third semiconductor region of the second conductivity type. Moreover, the photoelectric conversion device comprises an isolation region for electrically isolating the second semiconductor region from a fourth semiconductor region of the second conductivity type adjacent to the second semiconductor region. Wiring for applying voltage to the gate electrode is arranged on the isolation region. Here, a fifth semiconductor region of the second conductivity type having an impurity concentration lower than that of the fourth semiconductor region is provided between the fourth semiconductor region and the isolation region.

5 Claims, 4 Drawing Sheets

FIG. 5

PHOTOELECTRIC CONVERSION DEVICE AND IMAGE PICKUP SYSTEM WITH PHOTOELECTRIC CONVERSION DEVICE

CROSS REFERENCE TO RELATED APPLICATION

This application is a division of U.S. application Ser. No. 11/767,779, filed on Jun. 25, 2007, the entire disclosure of which is hereby incorporated by reference herein.

BACKGROUND OF THE INVENTION

1. Field of the Invention

The present invention relates to a photoelectric conversion device and a method of fabricating a photoelectric conversion device as well as an image pickup system with the photoelectric conversion device.

2. Description of the Related Art

In an image input device such as a digital camera, a video camera and an image reader and a focus detecting device used there for a photoelectric conversion device in which a plurality of pixels including a photoelectric conversion element is aligned is used. The photoelectric conversion device hereof includes a photoelectric conversion device so-called CCD type, a bipolar transistor type, an electric field effect transistor type and an MOS type, for example. The photoelectric conversion devices hereof are apt to increase in pixel. As the pixel area is reduced, the area of a photoelectric conversion element tends to decrease. Accordingly, necessity of handling smaller electric charges has arisen and necessity of reducing noise has arisen.

Japanese Patent Application Laid-Open Nos. 2003-258229 and 2005-142503 include disclosure on a noise in a photoelectric conversion device of an MOS type. Japanese Patent Application Laid-Open No. 2003-258229 includes disclosure on a noise taking place due to increase in minority carrier in a channel stop region of an MOS type photoelectric conversion device.

In addition, Japanese Patent Application Laid-Open No. 2005-142503 includes disclosure on leakage current due to an electric field taking place between adjacent FD regions due to increase in majority carrier in a channel stop region. Here, Japanese Patent Application Laid-Open No. 2005-142503 designs reduction in noise with arrangement of a channel stop region and a floating diffusion region (hereinafter to be referred to as FD region).

In addition, Japanese Patent Application Laid-Open No. 2001-230409 includes disclosure on structure of an MOS transistor for securing a withstand voltage in an isolation region of a general semiconductor device.

However, reduction in pixel area due to further increase in pixel is accompanied by lower degree of freedom in arrangement of an element. Moreover, fineness in the isolation region occasionally gives rise to leakage current also in a spot other than the region between the channel stop region and the FD region. In addition, the leakage current hereof flows into the photoelectric conversion element and the FD region to give rise to deterioration in signal-to-noise ratio.

Therefore, in view of the above described problems, an object of the present invention is to obtain a photoelectric conversion device and an image pickup system that reduce leakage current generated in an isolation region and are improved in signal-to-noise ratio.

SUMMARY OF THE INVENTION

A photoelectric conversion device of the present invention is a photoelectric conversion device including: a first semiconductor region of a first conductivity type; a second semiconductor region of a second conductivity type forming a photoelectric conversion element together with a part of the first semiconductor region; a gate electrode transferring an electric charge generated in the photoelectric conversion element to a third semiconductor region of the second conductivity type; an isolation region for electrically isolating the second semiconductor region from a fourth semiconductor region of the second conductivity type adjacent to the second semiconductor region; and a wiring arranged on the isolation region for applying voltage to the gate electrode; wherein a fifth semiconductor region of the second conductivity type having an impurity concentration lower than that of the fourth semiconductor region is disposed between the fourth semiconductor region and the isolation region.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

Further features of the present invention will become apparent from the following description of exemplary embodiments with reference to the attached drawings.

DESCRIPTION OF THE EMBODIMENTS

A photoelectric conversion device of the present invention is marked by structure of a semiconductor region (source or drain region of a transistor) adjacent to a photoelectric conversion element with an isolation region being present in between. Wiring linked to a gate electrode of a transfer transistor is arranged on the isolation region hereof. Such structure is marked by a semiconductor region with a low concentration on the isolation region side of the semiconductor region hereof.

The configuration of the present invention can alleviate an electric field being present between a semiconductor region of a first conductivity type in the lower part of the isolation region and a semiconductor region of a second conductivity type adjacent to the photoelectric conversion element and, therefore, can reduce leakage current. Therefore, a photoelectric conversion device with reduced noise and with an improved signal-to-noise ratio can be provided.

In addition, a method of fabricating a photoelectric conversion device of the present invention is marked by a method of fabricating a semiconductor region (source or drain region of a transistor) adjacent to a photoelectric conversion element with an isolation region being present in between. Wiring linked to a gate electrode of a transfer transistor is arranged on the isolation region hereof. Such structure includes a process of forming an insulation film arranged to cover the photoelectric conversion element, the wiring, the isolation region and a portion of the semiconductor region hereof. And such structure is marked by forming structure of alleviating an electric field on the isolation region side of the semiconductor region with the insulation film thereof.

The fabrication method of the present invention will enable fabrication of a leakage current reducing photoelectric conversion device easily. In addition, an insulation film arranged on a photoelectric conversion element is formed to, thereby, enable reduction in damages to the photoelectric conversion element at the time of fabrication and to enable further noise reduction. Therefore, a photoelectric conversion device with reduced noise and with improved signal-to-noise ratio can be provided.

Hereinafter embodiments will be specifically described with the drawings.

(Pixel Circuit and Drive Thereof)

Figure 4A:
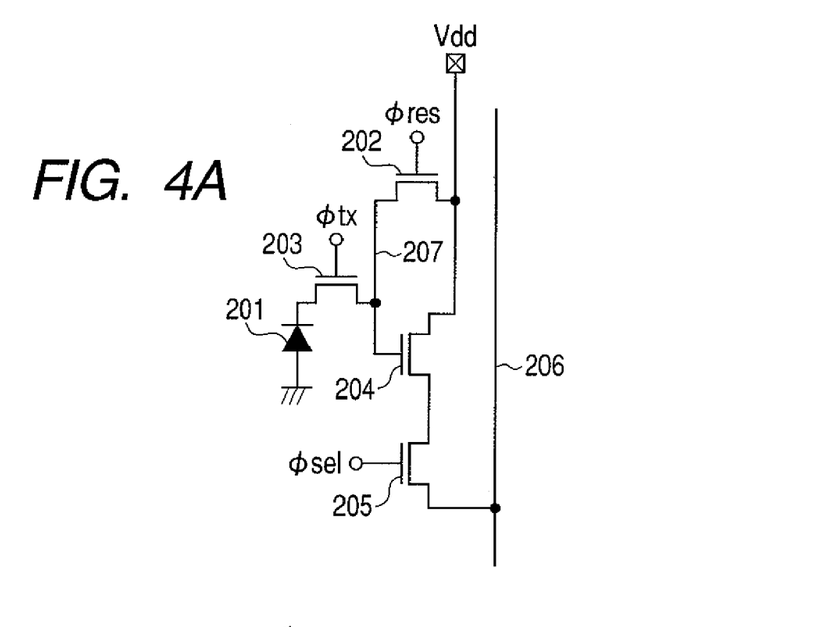
FIG. 4A exemplifies a pixel circuit of a photoelectric conversion device.
Figure 4B:
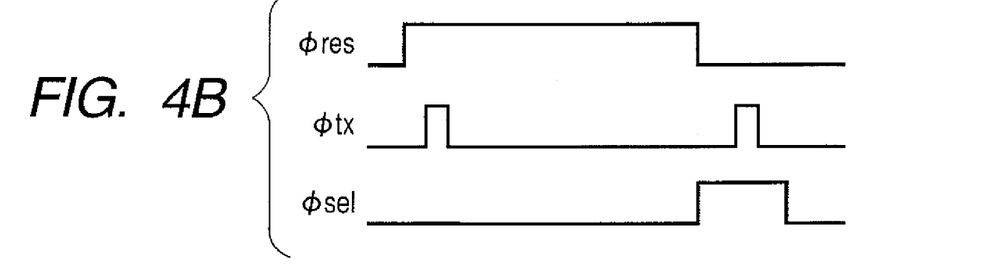
FIG. 4B exemplifies drive pulse of the photoelectric conversion device illustrated in FIG. 4A.

At first, an example of a pixel circuit configuration of a photoelectric conversion device is illustrated in FIG. 4A and a drive thereof is illustrated in FIG. 4B. FIG. 4A illustrates a circuit configuration of one pixel. A pixel includes a photoelectric conversion element or a photodiode 201, for example, a transfer transistor 203, a reset transistor 202, an amplifier transistor 204 and a selection transistor 205. Here a power source line is indicated by "Vdd" and the output destination is indicated by "206".

In the photodiode 201, an anode thereof is grounded. A cathode thereof is connected to a source of the transfer transistor 203. In addition, the cathode of the photodiode 201 can be adapted to function as a source of the transfer transistor 203. A drain of the transfer transistor 203 forms FD region 207. In addition, the gate electrode (also referred to as transfer gate electrode) of the transfer transistor 203 is applied with voltage φtx for driving the transfer transistor. Moreover, a drain of the reset transistor 202 is connected to the power source Vdd. The source thereof forms the FD region 207. In addition, the gate electrode of the reset transistor is applied with voltage φres for driving the reset transistor. The drain of the amplifier transistor 204 is connected to the power source Vdd; the source is connected to the drain of the selection transistor 205; and the gate electrode is connected to the FD region 207. The drain of the selection transistor 205 is connected to the source of the amplifier transistor 204 and the source is connected to an output line 206. And, the gate electrode of the selection transistor 205 is connected to a vertical selection line driven by a vertical selection circuit (not illustrated in the drawing).

The pixel having such a circuit configuration will be driven, for example, as illustrated in a pulse diagram in FIG. 4B. A high level of φres switches the reset transistor 202 on to provide the FD region 207 with reset potential. Concurrently, the φtx reaches a high level to provide the photodiode 201 with rest potential. Then, the φtx reaches a low level so that electric carrier is accumulated in the photodiode 201. The φsel reaches a high level so that the output based on the reset potential of the FD region 207 is outputted to the output line 206. After the φtx reaches a high level again, the electric carrier of the photodiode 201 is transferred to the FD region 207 so that a signal is output based on potential of the FD region 207 after the electric charge is transferred to the output line 206. Here, a high level and a low level refer to predetermined voltage. For example, +5 V and 0 V or the like. In addition, for the φtx, negative voltage such as −1 V, for example, being voltage that sufficiently switches transfer transistor off is provided so that the electric carrier are accumulated in the photodiode 201.

The present invention will not be limited to the circuit configuration and drive illustrated herein but is applicable, for example, to a circuit configuration lacking in a transfer transistor or a circuit configuration with a plurality of photodiodes sharing the amplifier transistor. In addition, the connected portion is adapted to share connections with wiring and impurity regions.

In addition, a semiconductor substrate being a material substrate is expressed as "substrate", which, however, will include the case where a material substrate described below undergoes processing. For example, a member in the state where one or a plurality of semiconductor regions and the like is formed, a member in the midst of a series of fabrication process; or a member having gone through a series of fabrication process can be called a substrate. Moreover, the isolation region electrically isolates the adjacent elements and, in other words, is comprehensible to electrically isolate active regions of the elements.

Hereinafter, the present invention will be described in detail by presenting embodiments.

First Embodiment

Figure 1:
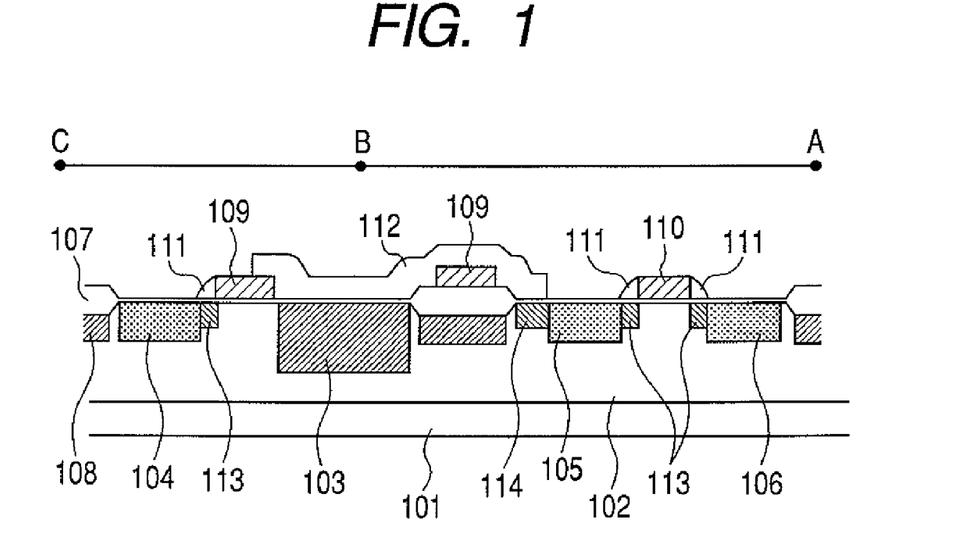
FIG. 1 is a schematic section of a photoelectric conversion device in a first embodiment.
Figure 3:
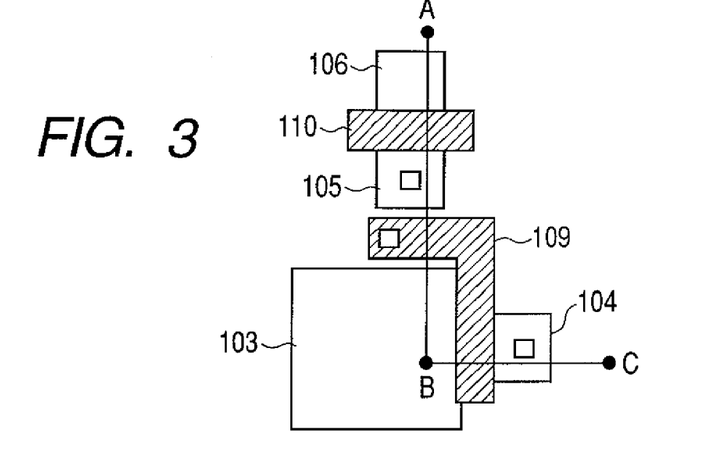
FIG. 3 is a schematic plan view of a portion of a pixel of a photoelectric conversion device.

For describing the present embodiment, FIG. 3 illustrates a plane layout of a portion of the pixel illustrated in FIG. 4A. Specifically, FIG. 3 illustrates a photodiode 201, a transfer transistor 203, an FD region 207 and an amplifier transistor 204. In describing FIG. 3 and FIG. 4 in a corresponding manner, an n-type semiconductor region 103 adapts a photodiode 201 and a gate electrode is included in wiring 109 of a transfer transistor 203. Hereinafter, the wiring 109 will be adopted to simplify description. That gate electrode 109 is formed of material selected from the group consisting of n-type polysilicon and polysilicon subjected to silicidation. An n-type semiconductor region 104 corresponds to the FD region 207. In addition, as an element adjacent to the photodiode with an isolation region being present in between, the present embodiment includes the amplifier transistor 204 for description. There is a drain 105 of the amplifier transistor 204, a source 204 of the amplifier transistor 204 and a gate electrode 106 of the amplifier transistor 204. An n-type semiconductor region 105 being a drain region of an amplifier transistor is adjacent to an n-type semiconductor region 103 to adapt a photodiode with an isolation region being present in between. Here the drain 105 hereof is provided with voltage from the power source Vdd. In addition, white squares indicate contact sites. Next, a schematic section along the line A-B-C is illustrated in FIG. 1. There is an n-type semiconductor substrate 101. There is a p-type semiconductor region 102 and an n-type semiconductor region 103. The n-type semiconductor region 103 is a part of the photoelectric conversion element forming PN-junction together with the p-type semiconductor region 102. A gate electrode 109 transfers, to the n-type semiconductor region 104, electric charges generated in the photoelectric conversion element and accumulated in the n-type semiconductor region 103. Here, the n-type semiconductor region 104 is an FD region and functions as a drain of the transfer transistor. And the amplifier transistor is illustrated as an element adjacent to the photoelectric conversion element. There is a drain 105, a source 106 and a gate electrode 110 of the amplifier transistor. The n-type semiconductor regions 105 and 106 are higher than the above described n-type semiconductor region 103 in impurity concentration. In addition, voltage from the power source Vdd is input to the n-type semiconductor region 105. An isolation region 107 is in LOCOS structure. A p-type semiconductor region 108 is higher than p-type semiconductor region 102 in impurity concentration. The isolation region 107 may be in either LOCOS (Local Oxidation of Silicon) structure or STI (Shallow Trench Isolation) structure. The p-type semiconductor region 108 can be caused to function as a channel stop region. An n-type semiconductor region 113 is lower in impurity concentration than the n-type semiconductor regions 104 and 105 and the like and forms an LDD (Lightly doped drain) structure of a transistor. And, an n-type semiconductor region 114 is arranged between the n-type semiconductor region 105 and the isolation region 107 adjacent thereto. It can be said here that the n-type semiconductor region 114 is arranged between the n-type semiconductor region 105 and the channel stop region 108. The n-type semiconductor region 114 hereof is lower in impurity concentration than the n-type semiconductor region 105. It can be said that the n-type semiconductor regions 105 and 114 adapt the drain of the amplifier transistor. A side wall 111 is utilized at an occasion of forming the LDD structure in the region corresponding to the channel of the gate electrode of the transistor. An oxide film 112 is arranged over the n-type semiconductor region 114, the isolation region 107, the gate electrode or the wiring 109 providing the gate electrode with potential and the n-type semiconductor region 103. The oxide film 112 can be used to form the n-type semiconductor region 114.

Here, the problem of the present embodiment, that is, the mechanism of leakage current, will be described. The isolation region tends to become finer. At an occasion of arranging the gate electrode of the transfer transistor or the wiring thereof on the isolation region hereof, majority carriers occasionally increases to increase effective concentration thereof in the semiconductor region in the lower part of the isolation region. Then a large electric field is occasionally generated in the semiconductor region composing the element adjacent to the photoelectric conversion element and between the semiconductor region with increased effective concentration and the semiconductor region of a reverse conductivity type to give rise to leakage current. Specifically, electron is designated as electric charge treated as the signal of photoelectric conversion device and the case where the above described transistor is an n-type transistor will be described.

As in the preceding description, the photoelectric conversion device has a period of accumulating electric charges in the photoelectric conversion element. During the accumulation period hereof, negative voltage is occasionally applied to the gate electrode of the transfer transistor and the wiring 109. Hereinafter, for the sake of simplicity, a gate electrode and wiring of applying voltage to the gate electrode will be described as the gate electrode. Such drive with a gate electrode adapted to and arranged on the isolation region 107 gives rise to a change in the effective concentration of the semiconductor region in the lower portion of the isolation region 107 due to potential of the gate electrode 109. In the present embodiment, in the channel stop region 108 being the P-type semiconductor region, the concentration of electron holes being the majority carrier increases to increase the impurity concentration effectively. Then, a large electric field is generated between the P-type semiconductor region 108 and the n-type semiconductor region 105 and is apt to give rise to leakage current. And the leakage current hereof flows in the n-type semiconductor region 103 and the like adjacent to the n-type semiconductor region 105 to act as noise. Here, the present embodiment is provided with the channel stop region 108. But also in the case where the channel stop region 108 is not provided, the effective concentration of the p-type semiconductor region 102 increases in the lower portion of the isolation region 107 where the gate electrode 109 is arranged, giving rise to a likewise problem. Moreover, in the present embodiment, voltage is input from the power source Vdd to the n-type semiconductor region 105. In such a case, a larger electric field is generated to give rise to larger leakage current. In addition, material of the gate electrode 109 occasionally increases the effective concentration of P-type semiconductor region 108. The material thereof is selected from the group consisting of the above described n-type polysilicon and silicide of polysilicon, for example.

Therefore, the n-type semiconductor region 114 lower in impurity concentration than the n-type semiconductor region 105 is arranged in the present embodiment. The n-type semiconductor region 114 and the n-type semiconductor region 105 and the n-type semiconductor region 113 forming the LDD structure form a drain. That is, in other words, the n-type semiconductor region of the drain or the source of the transistor is structured to include the portion with low impurity concentration being present on the side of the isolation region in addition to the LDD structure on the channel side. The n-type semiconductor region 114 hereof will enable alleviation of the electric field between the p-type semiconductor region 108 with effectively intensified concentration and the n-type semiconductor region 105 and reduction of leakage current. A portion of the drain or the source has the n-type semiconductor region with the low impurity concentration. Thereby contact hole is occasionally formed on the n-type semiconductor region with the low impurity concentration at the time of contact forming. Then contact resistance is occasionally influenced. Therefore, only in the particularly effective site, the n-type semiconductor region with low impurity concentration is desirably formed. For example, the n-type semiconductor region 105 to which the power supply voltage is applied as in the present embodiment is desirable.

In addition, concurrently, the n-type semiconductor region 113 has the LDD structure and, thereby, a short channel effect can be reduced and, moreover, noise can be reduced.

Here, in the case where potential of the gate electrode 109 thereof is negative, leakage current is more apt to take place. Therefore, it is effective to arrange the n-type semiconductor region 114. In addition, the case where material of the gate electrode 109 is material including difference in the work function in the lower portion of the isolation region 107, and the case where the channel stop region 108 is present in the lower portion of the isolation region 107 are likewise.

Here, the case where the channel stop region 108 is in the lower portion of the isolation region 107 will also enable decrease in noise in the case where the gate electrode 109 is provided with voltage for switching the transistor on. Therefore, arrangement of the channel stop region 108 and the n-type semiconductor region 114 will be able to provide a photoelectric conversion device in which noise is reduced due to potential of the gate electrode 109.

Second Embodiment

Figure 2A:
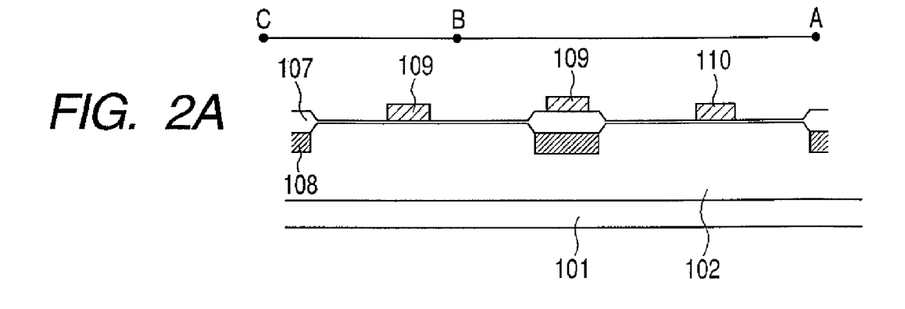
FIG. 2A is a schematic section of a photoelectric conversion device in a second embodiment.
Figure 2B:
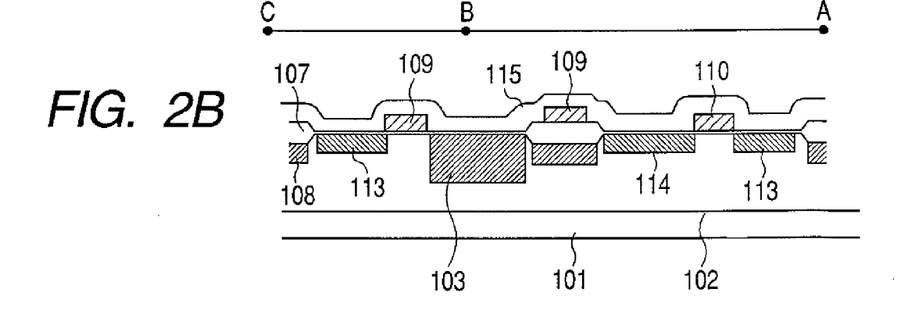
FIG. 2B is a schematic section of a photoelectric conversion device in a second embodiment.
Figure 2C:
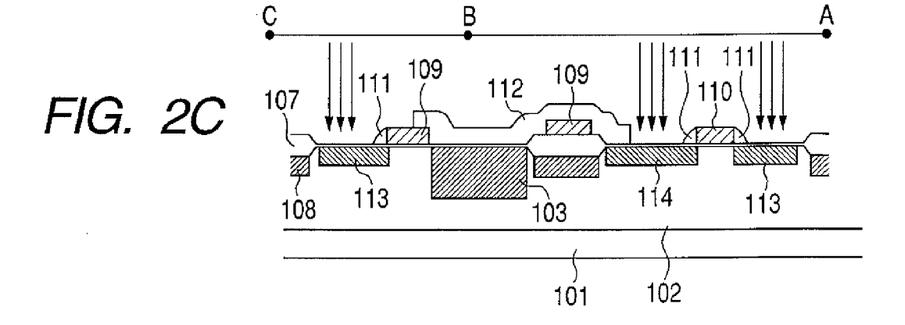
FIG. 2C is a schematic section of a photoelectric conversion device in a second embodiment.
Figure 2D:
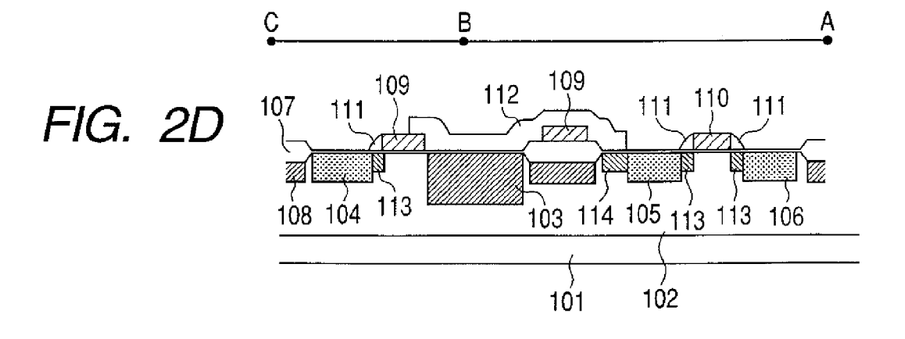
FIG. 2D is a schematic section of a photoelectric conversion device in a second embodiment.

FIG. 2D illustrates a schematic section of a photoelectric conversion device in a second embodiment. And, FIG. 2A to FIG. 2D illustrate a schematic section for describing a fabrication method. Unlike the first embodiment in FIG. 1, FIG. 2D is characterized by forming the n-type semiconductor regions 113 and 114 with the same process. In addition, the configuration including the same function shares the same symbols and is described in the same expression.

The process of fabrication will be described in order from FIG. 2A. At first, the p-type semiconductor region 102 is formed in the n-type semiconductor substrate 101 and an oxide film is grown on the surface by 15 nm to 25 nm, for example. Moreover, a silicon nitride film is deposited by 100 nm to 200 nm, for example. Thereafter, the silicon nitride film undergoes patterning by photolithography with a mask for the isolation region. And, a boron ion, for example, is implanted to the pattern thereof in a self-aligned manner to form the channel stop region 108 being the P-type semiconductor region. Thereafter, the normal LOCOS method is employed to grow the isolation region 107 to, for example, 300 nm to 500 nm. And the polysilicon film is deposited to 250 nm to 350 nm to form the gate electrode of the transistor or the wiring 109 or 110 with photolithography and the process goes to FIG. 2A. Here, the channel stop region 108 may be formed by ion implantation under the condition of piercing through the isolation region 107 after forming the isolation region 107. Film thickness of the isolation region 107 hereof will be around 220 nm to 270 nm at last.

And a resist mask undergoes patterning by photolithography to form the n-type semiconductor region 103 composing a photodiode by ion implantation. Moreover, a phosphorus ion, for example, is implanted to form the n-type semiconductor regions 113 and 114 with low impurity concentration forming the LDD structure in the transistor.

Thereafter an oxide film being an insulation film is formed. With TEOS (tetraethoxysilane) gas and the like, CVD (chemical vapor deposition) method is employed to form the oxide film 115 of 100 nm to 300 nm, for example, to attain the shape in FIG. 2B. The oxide film 115 hereof undergoes patterning and is used as a mask so that the regions 104 and 105 with high impurity concentration can be formed. Moreover, it is possible to protect the n-type semiconductor region 103 composing the photodiode. The details will be described below.

Mask material (not illustrated in the drawing) such as photoresist and the like is formed on the oxide film 115 and undergoes patterning to provide a mask. And the oxide film 115 undergoes patterning with the mask hereof to form the side wall 111 of the gate electrodes 109 and 110 of the transistors in FIG. 2C and the oxide film 112. The side wall 111 can be used as a mask at the occasion of ion implantation for forming n-type semiconductor regions 104, 105 and 106 higher in impurity concentration than the n-type semiconductor region 113. In addition, the oxide film 112 extends to the portion where the drain or the source of the transistor is formed to cover the gate electrode 109 and the isolation region 107. At the occasion of forming the n-type semiconductor region 105, the oxide film 112 is used as a mask. And structure with the n-type semiconductor region 114 being lower in impurity concentration than the n-type semiconductor region 105 can be formed easily in the lower portion where the oxide film 112 thereof extends. The process of ion implantation hereof is illustrated in FIG. 2C. The portions where ions are implanted are indicated by arrows. Specifically, with the oxide film 112 and the side wall 111 as a mask, arsenic ions, for example, are implanted in a self-aligned manner. At that occasion, arsenic ion implantation is carried out in larger in dosage than the occasion of implantation of the above described phosphorous ions. Thereby, the drain of the transistor is formed in structure including the n-type semiconductor regions 104, 105 and 106 and the n-type semiconductor regions 113 and 114 being lower in impurity concentration than the n-type semiconductor regions 104, 105 and 106.

Moreover, as the process thereafter, the oxide film 112 thereof is covered and an interlayer insulation film is formed on the semiconductor substrate. The contact opening (so-called contact hole) is formed in the interlayer insulation film. Conductive material is formed in the contract hole. And the contact for connecting to the n-type semiconductor region 105 and the like. And subjected to the process of forming wiring, a color filter or the like, the photoelectric conversion device is formed.

Here, the oxide film 112 hereof is arranged not only on the n-type semiconductor region 104, the gate electrode 109 and the isolation region 107 but also on the n-type semiconductor region 103. Thereby, it will be possible to protect the n-type semiconductor region 103 composing the photodiode from the damage such as dry etching. In addition, a nitride film can be arranged between the oxide film 112 and the n-type semiconductor region 103. That stacking can be in reverse order, but which function as reflection reduction. In that case, the nitride film can be provided with thickness of 40 nm to 60 nm and the oxide film is provided with thickness of around 150 nm to 200 nm.

In addition, in the case where width of the isolation region 107 is shorter, accuracy in stacking the pattern of the isolation region 107 and the pattern of the gate electrode 109 will occasionally result in causing the gate electrode 109 to come closer to the n-type semiconductor region 105. Therefore, the oxide film 112 on the isolation region 107 can be caused to extend to not less than 0.2 μm and, if possible, around 0.3 μm to 0.4 μm from the end section of the isolation region 107 to the n-type semiconductor region 105 side. Thereby, it is possible to set the gate electrode 109 and the n-type semiconductor region 105 apart. Also in the case where displacement takes place in patterning of the gate electrode 109, reduction in noise will become feasible.

The present embodiment is provided with the channel stop region 108, which, however, may be eliminated. In addition, at least a part of the channel stop region 108 can be provided with a p-type semiconductor region higher than the channel stop region 108 in impurity concentration. In that occasion, reduction in noise in drive called transfer of electric charge of photoelectric conversion device will be attainable.

In addition, in the present embodiment, the n-type semiconductor region 113 with low impurity concentration and the n-type semiconductor region 114 with low impurity concentration on the isolation region 107 side in the LDD structure of the transistor were formed through the same process. Thereby, the process is simplified and concurrently the performance of a transistor can be improved and a photoelectric conversion device with less noise will be attainable. Of course, the n-type semiconductor regions 113 and the n-type semiconductor regions 114 can be formed with another process.

Moreover, with the fabrication method of the present embodiment, it is possible to form no n-type semiconductor region 114 between the isolation region 107 and the n-type semiconductor region 105. For example, at the occasion of forming the n-type semiconductor region 114, the resist mask covering the n-type semiconductor region 103 is caused to extend to reach a part of the active region between the isolation region 107 and the gate electrode 110. And ion implantation for forming the n-type semiconductor region 114 is carried out. And, the insulation film 115 illustrated in FIG. 2B is formed and the subsequent process continues. Subjected to such a process, it is also possible to form structure to form no n-type semiconductor region 114 between the isolation region 107 and the n-type semiconductor region 105. Also the structure hereof can alleviate the electric field between the gate electrode 109 and the n-type semiconductor region 105.

So far, the present embodiment has been described. Likewise the first embodiment, the photoelectric conversion device of the present embodiment includes the gate electrode for a transfer transistor and the wiring 109 providing the gate electrode thereof with potential being arranged on the isolation region 107. At that occasion, the n-type semiconductor region 114 is formed between the isolation region 107 thereof and the n-type semiconductor regions 105 adjacent to the isolation region 107 and thereby reduction in noise will become feasible.

In addition, since the transistor has the LDD structure, a short channel effect can be reduced and, moreover, the photoelectric conversion device in which noise is further reduced can be provided. In addition, the n-type semiconductor region 113 and the n-type semiconductor region 114 in the LDD structure can be formed in the same process to enable reduction in the process. In addition, the side wall 111 used as a mask at the occasion of forming the n-type semiconductor region 113 and the n-type semiconductor region 114 and the oxide film 112 can be formed from the same oxide film 115. In addition, the oxide film 112 is arranged up to on the n-type semiconductor region 103, and, thereby, the damage to the n-type semiconductor region 103 during fabrication due to etching and the like can be reduced. Therefore, a photoelectric conversion device having a more noiseless photoelectric conversion element can be formed.

(Application to Image Pickup System)

Figure 5:
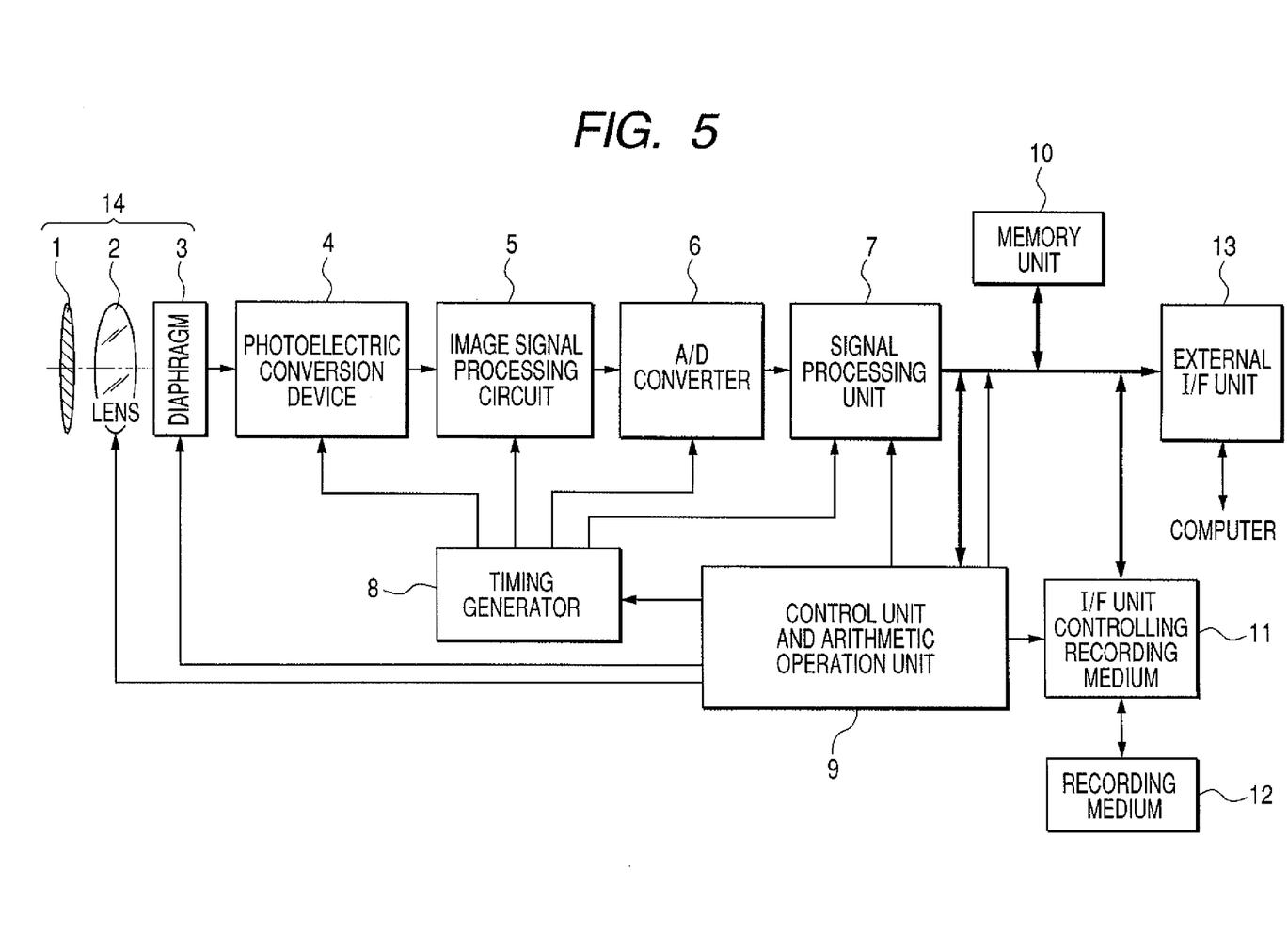
FIG. 5 illustrates an example of an image pickup system.

FIG. 5 is a block diagram in the case of application to a digital still camera as an example of applying photoelectric conversion device described in the above described embodiments to an image pickup system.

An optical system 14 including a shutter 1, an image pickup lens 2, and a diaphragm 3 is a configuration for taking light into the photoelectric conversion device 4 to form an image. The shutter 1 controls exposure to the photoelectric conversion device 4. Incident light is focused onto the photoelectric conversion device 4 with the image pickup lens 2. At that occasion, the luminous quantity is controlled with the diaphragm 3. The shutter 1 and the like can be eliminated.

A signal having been output from the photoelectric conversion device 4 corresponding with the intake light undergoes processing in the image signal processing circuit 5 and is converted from an analog signal to a digital signal with an analog/digital converter (A/D converter) 6. Moreover, the digital signal having been output undergoes arithmetic operation in the signal processing unit 7 to generate a taken image data. Corresponding with the operation mode setting of a photographer, the taken image data can be accumulated into memory 10 installed in a digital still camera and can be transmitted to external appliances such as a computer, a printer and the like through an external interface (I/F) unit 13. In addition, the taken image data can be stored detachable storage medium 12 in the digital still camera through an interface (I/F) unit 11 controlling recording medium.

The photoelectric conversion device 4, the image signal processing circuit 5, the A/D converter 6 and the signal processing unit 7 are controlled with a timing generator 8. In addition, the entire system is controlled with the control unit and arithmetic operation unit 9. In addition, those systems can be formed through the same process on the same semiconductor substrate as the photoelectric conversion device 4.

Thus, the photoelectric conversion device of the present invention is used in an image pickup system and, thereby, it will become possible to provide a noise-reduced image pickup system with a good signal-to-noise ratio. In addition, since the noise is reduced also in a fine pixel and, therefore, a photoelectric conversion device with more pixels or a compact photoelectric conversion device can be used and higher-performance image pickup system can be provided. Here, there are other image pickup systems such as a video camera and a facsimile and the like.

As described above, according to the present invention, a photoelectric conversion device with noise reduction and an improved SN ratio will become obtainable. In addition, since the noise is reduced also in a fine pixel and, therefore, a photoelectric conversion device with more pixels or a compact photoelectric conversion device can be used and higher-performance image pickup system can be provided.

In addition, in the embodiments of the present invention, the conductivity type and the fabrication method will not be limited to the respective embodiments. For example, the conductivity type and pixel configuration of a semiconductor substrate will not be limited to configuration described above. And, for example, the respective semiconductor regions may be made of a plurality of semiconductor regions according to a fabrication process thereof as long as similar functions are provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-189244, filed Jul. 10, 2006, which is hereby incorporated by reference herein in its entirety.

What is claimed is:

1. A method of fabricating a photoelectric conversion device that includes a first semiconductor region of a first conductivity type; a second semiconductor region of a second conductivity type forming a photoelectric conversion element together with a part of the first semiconductor region; a third semiconductor region of the second conductivity type; a transfer gate electrode transferring electric carriers generated in the photoelectric conversion element to the third semiconductor region; an element isolation region for electrically isolating the photoelectric conversion element from a transistor adjacent to the photoelectric conversion element; a fourth semiconductor region of the second conductivity type being arranged adjacent to the second semiconductor region to sandwich the element isolation region the fourth semiconductor region and the second semiconductor region, and forming a source or a drain of a transistor adjacent to the photoelectric conversion element; and a wiring arranged on the element isolation region for applying voltage to the transfer gate electrode, wherein the method comprises:

forming the second semiconductor region in the first semiconductor region;

forming the transfer gate electrode, the wiring, and a gate electrode of a transistor adjacent to the photoelectric conversion element;

forming an insulation film covering the second semiconductor region, the wiring, the element isolation region, and a portion of an activation region between the element isolation region and the gate electrode of the transistor adjacent to the photoelectric conversion element;

implanting impurity ions for the second conductive type into a portion not covered by the insulation film in the activation region with the insulation film as a mask to form the fourth semiconductor region;

forming an interlayer insulation film covering the insulation film; and forming an opening for contact corresponding to the fourth semiconductor region in the interlayer insulation film.

2. The method of fabricating a photoelectric conversion device according to claim 1, wherein, before forming the insulation film, a fifth semiconductor region of the second conductivity type, having a lower impurity concentration than that of the fourth semiconductor region, is formed in at least a portion of the activation region.

3. The method of fabricating a photoelectric conversion device according to claim 1, wherein the first conductivity type is a p-type and a negative voltage is applied to the wiring.

4. The method of fabricating a photoelectric conversion device according to claim 1, wherein the second conductivity type is a n-type and a positive voltage from a power source is applied to the fourth semiconductor region.

5. The method of fabricating a photoelectric conversion device according to claim 1, wherein the method further comprises forming a sixth semiconductor region of the first conductivity type having an impurity concentration higher than that of the first semiconductor region below the element isolation region.

* * * * *